United States Patent
Zhang

(10) Patent No.: US 11,268,020 B2
(45) Date of Patent: Mar. 8, 2022

(54) HYBRID QUANTUM DOT NANO-MATERIAL, METHOD FOR PREPARING THE SAME AND PHOTOLUMINESCENCE DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Aidi Zhang, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 64 days.

(21) Appl. No.: 16/763,038

(22) PCT Filed: Nov. 19, 2019

(86) PCT No.: PCT/CN2019/119420
§ 371 (c)(1),
(2) Date: May 11, 2020

(87) PCT Pub. No.: WO2020/143334
PCT Pub. Date: Jul. 16, 2020

(65) Prior Publication Data
US 2021/0348051 A1    Nov. 11, 2021

(30) Foreign Application Priority Data
Jan. 7, 2019  (CN) .......................... 201910011746.5

(51) Int. Cl.
C09K 11/02    (2006.01)
H01L 51/50    (2006.01)
(Continued)

(52) U.S. Cl.
CPC ............ *C09K 11/025* (2013.01); *C09K 11/06* (2013.01); *C09K 11/54* (2013.01); *C09K 11/58* (2013.01);
(Continued)

(58) Field of Classification Search
CPC ....... B82Y 20/00; B82Y 40/00; C09K 11/025; C09K 11/06; C09K 11/7715;
(Continued)

(56) References Cited

U.S. PATENT DOCUMENTS 9,368,740 B2 * 6/2016 Tang .................... C09K 11/883
2010/0224931 A1  9/2010 Hsieh

FOREIGN PATENT DOCUMENTS

CN    103911142 A    7/2014
CN    108624317 A    10/2018
(Continued)

OTHER PUBLICATIONS

Decision of Rejection dated Oct. 12, 2020 corresponding to Chinese application No. 201910011746.5.
(Continued)

*Primary Examiner* — C Melissa Koslow
(74) *Attorney, Agent, or Firm* — Nath, Goldberg & Meyer; Joshua B. Goldberg

(57) ABSTRACT

The invention provides a quantum dot particle and a preparation method thereof. The quantum dot particle includes at least one quantum dot core, a first protective layer covering the quantum dot core, and a second protective layer covering the first protective layer, wherein at least one hybrid nanoparticle is dispersed in the second protective layer, and the hybrid nanoparticle is configured to generate a near-field plasmon effect under irradiation of excitation light. The quantum dot particle has a higher fluorescence quantum
(Continued)

yield. The invention also provides a photoluminescence device containing the quantum dot particle.

15 Claims, 2 Drawing Sheets

(51) Int. Cl.
  *C09K 11/77* (2006.01)
  *C09K 11/59* (2006.01)
  *C09K 11/54* (2006.01)
  *C09K 11/06* (2006.01)
  *C09K 11/70* (2006.01)
  *C09K 11/58* (2006.01)
  *B82Y 40/00* (2011.01)
  *B82Y 20/00* (2011.01)

(52) U.S. Cl.
  CPC .............. *C09K 11/59* (2013.01); *C09K 11/70* (2013.01); *C09K 11/703* (2013.01); *C09K 11/7715* (2013.01); *C09K 11/7717* (2013.01); *H01L 51/502* (2013.01); *B82Y 20/00* (2013.01); *B82Y 40/00* (2013.01)

(58) Field of Classification Search
  CPC ... C09K 11/7717; C09K 11/70; C09K 11/703; C09K 11/59; C09K 11/58; C09K 11/54
  See application file for complete search history.

(56) References Cited

FOREIGN PATENT DOCUMENTS

| | | |
|---|---|---|
| CN | 109679656 A | 4/2019 |
| KR | 1020150091869 A | 8/2015 |

OTHER PUBLICATIONS

First Office Action dated Nov. 29, 2019 corresponding to Chinese application No. 201910011746.5.

Second Office Action dated Jun. 10, 2020 corresponding to Chinese application No. 201910011746.5.

Tibbals, "Medical Technology and Nanomedicine"; Xian Jiaotong University Press; Dec. 2013.

Kim, et al. "Switching Off FRET in the Hybrid Assemblies of Diblock Copolymer Micelles, Quantum Dots, and Dyes by Plasmonic Nanoparticles"; ACS Nano; vol. 6, No. 6; 2012.

Wu, et al. "Photoluminescence plasmonic enhancement in InAs quantum dots coupled to gold nanoparticles" Materials Letters; 2011.

* cited by examiner

HYBRID QUANTUM DOT NANO-MATERIAL, METHOD FOR PREPARING THE SAME AND PHOTOLUMINESCENCE DEVICE

CROSS REFERENCE TO RELATED APPLICATION

This is a National Phase Application filed under 35 U.S.C. 371 as a national stage of PCT/CN2019/119420, filed Nov. 19, 2019, an application claiming the benefit of Chinese Application No. 201910011746.5, filed Jan. 7, 2019, the content of each of which is hereby incorporated by reference in its entirety.

TECHNICAL FIELD

The present invention relates to the field of photoelectric material, and in particular, to a quantum dot particle, a method for preparing the same, and a photoluminescence device including the same.

BACKGROUND

Quantum dots are important fluorescent nanomaterial. By virtues of wide absorption spectrum, narrow emission spectrum, high quantum yield, etc., quantum dots are widely used in the field of bioimaging, biosensors, photodiodes, solar cells and the like.

When used in applications such as illumination, display and biotherapy, quantum dots are required to maintain a high fluorescence emission intensity over a long period of time in a specific environment. Unfortunately, in practical applications, during the process of excitation light passing through the medium and irradiating to the quantum dots, the intensity of the excitation light may be lost or reduced. Consequently, it is difficult for the quantum dots to obtain high excitation energy, and thereby being difficult to obtain an ideal fluorescence quantum yield.

Conventionally, the excitation energy of the excitation light is increased, so as to increase the fluorescence quantum yield of the quantum dots. However, when applied in applications such as cell analysis or cell imaging, it will cause serious damage or destruction to the cell structure or intracellular biological macromolecules if the excitation light energy is too high. Therefore, how to improve the luminous intensity or luminous efficiency of quantum dots under a given excitation energy is an urgent issue needs to be addressed in applications.

SUMMARY

An object of the present invention is to provide a quantum dot particle, a method for preparing the same, and a photoluminescence device including the same. The quantum dot particle has a higher fluorescence quantum yield without increasing the excitation energy.

In order to achieve the above object, as a first aspect of the present invention, it provides a quantum dot particle including at least one quantum dot core, a first protective layer covering the quantum dot core and a second protective layer covering the first protective layer, wherein at least one hybrid nanoparticle is dispersed in the second protective layer and the hybrid nanoparticle is configured to generate a near-field plasmon effect under irradiation of a excitation light.

Optionally, the hybrid nanoparticle includes an ultraviolet absorbent.

Optionally, the hybrid nanoparticle includes any one or more of nano ceria, nano zinc oxide, and black phosphorus quantum dot.

Optionally, the quantum dot core has a size of 3 nm to 15 nm.

Optionally, the first protective layer is a first polymer layer and has a thickness between 2 nm and 50 nm.

Optionally, the first protective layer includes a mesoporous material layer and an optical modifier filled in mesoporous of the mesoporous material layer, wherein the mesoporous material layer and the optical modifier together form a heterostructure in which a refractive index is sequentially changed.

Optionally, the optical modifier is a fluorescent-response material. The optical modifier emits light when a light emitted by the quantum dot core is irradiated on the optical modifier.

Optionally, the optical modifier is a fluorescent dye.

Optionally, the mesoporous material layer includes a material selected by at least one or more of mesoporous silicon dioxide, mesoporous aluminum oxide and mesoporous titanium dioxide.

Optionally, the second protective layer has a thickness between 2 nm and 30 nm.

Optionally, the second protective layer includes any one or more of methyl methacrylate, divinyl benzene, cross-linked chitosan, cross-linked cellulose and cross-linked polyvinylpyrrolidone.

As a second aspect of the present invention, it provides a method for preparing a quantum dot particle including the following steps:

providing at least one quantum dot core;

forming a first protective layer coating at least one quantum dot core;

attaching at least one hybrid nanoparticle on the first protective layer; and forming a second protective layer on the first protective layer so that the hybrid nanoparticle dispersed in the second protective layer, thereby obtaining the quantum dot particle;

wherein the hybrid nanoparticle is configured to generate a near-field plasmon effect under irradiation of excitation light.

Optionally, the step of forming a first protective layer in the method includes:

forming a mesoporous material layer outside the quantum dot core by mixing and reacting a precursor solution of the mesoporous material with at least one quantum dot core;

modifying the mesoporous material layer by mixing the mesoporous material layer with a mercapto compound, and the modified mesoporous material layer has a mesoporous surface with a first ligand functional group; and filling an optical modifier in the mesoporous by mixing the modified mesoporous material layer with the optical modifier;

wherein the optical modifier has a surface with a second ligand functional group which is formed by modification with a carbon-carbon double bond compound, and the optical modifier is fixed inside the mesoporous by the combination of the first ligand functional group and the second ligand functional group.

Optionally, the step of attaching at least one hybrid nanoparticle on the first protective layer includes:

stirring the quantum dot core coated with the first protective layer and the hybrid nanoparticle in an organic solvent under a heating condition.

As a third aspect of the present invention, it provides a photoluminescence device including a photoluminescence material layer, wherein the photoluminescence material layer includes the above-mentioned quantum dot particle provided by the present invention.

DESCRIPTION OF THE FIGURES

The drawings are used to provide a further understanding of the present invention, and constitute a part of the specification, together with the following specific embodiments to explain the present invention, but do not constitute a limitation of the present invention. In the drawings.

DETAILED DESCRIPTION OF EMBODIMENTS

The specific embodiments of the present invention will be described in detail below with reference to the drawings. It should be understood that the specific embodiments described herein are only used to illustrate and explain the present invention, and are not intended to limit the present invention.

The inventor of the present invention has found through repeated research that in order to excite a quantum dot to emit light, it is usually necessary to irradiate the quantum dot with excitation light. However, after the excitation light passes through dielectric layer, the energy has been reduced when it reaches the quantum dot, which leads to a decrease in the fluorescence quantum yield of the quantum dot.

Figure 1:
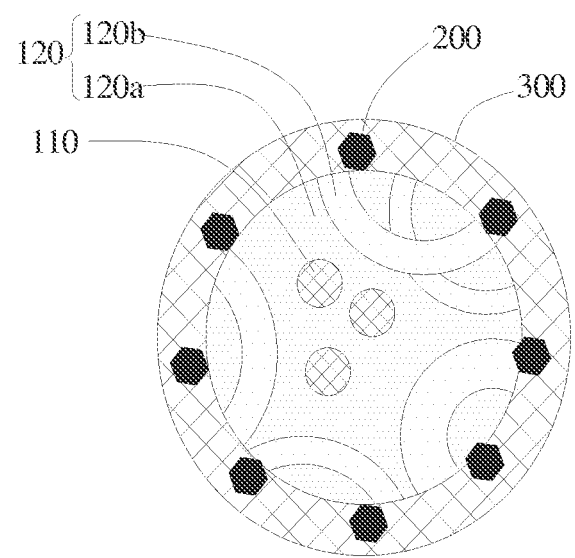
FIG. 1 is a schematic diagram of the structure of the quantum dot particle of the present invention.

As an aspect of the present invention, a quantum dot particle is provided. As shown in FIG. 1, the quantum dot particle includes at least one quantum dot core 110, a first protective layer 120 covering the quantum dot core 110, and a second protective layer 300 covering the first protective layer 120, wherein at least one hybrid nanoparticle 200 is dispersed in the second protective layer 300 and the hybrid nanoparticle 200 generates a near-field plasmon effect under the action of excitation light.

It needs to be explained that the "excitation light" refers to light that can excite the quantum dot core 110 to emit light by irradiating the quantum dot core 110. Since the hybrid nanoparticle 200 is introduced into the quantum dot particle, when the excitation light passes through the quantum dot particle, a portion of the excitation light irradiates on the quantum dot core 110 and other portion thereof irradiates on the hybrid nanoparticle 200.

Figure 2:
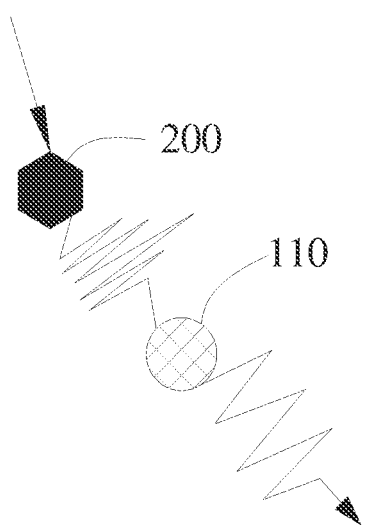
FIG. 2 is a schematic diagram of the hybrid nanoparticle in the quantum dot particle of the present invention realizing an optical antenna effect.

As shown in FIG. 2, since the hybrid nanoparticle 200 has an optical antenna effect, it can generate a near-field plasmon effect by receiving excitation light. Under the action of the near-field plasmon effect, the charge around the hybrid nanoparticle 200 oscillates, and the electric field intensity near the hybrid nanoparticle 200 increases. Correspondingly, in the same quantum dot particle with the hybrid nanoparticle 200, the electric field intensity around the quantum dot core 110 increases, and then causes the quantum dot core 110 to obtain more excitation energy. The more excitation energy the quantum dot core 110 obtains, the higher the fluorescence quantum yield is.

Figure 3:
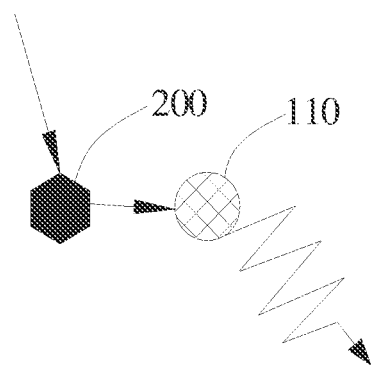
FIG. 3 is a schematic diagram of the hybrid nanoparticle in the quantum dot particle of the present invention reflecting light to the quantum dot core and the quantum dot core absorbing energy and emitting light.

In addition, as shown in FIG. 3, the hybrid nanoparticle 200 can also reflect the excitation light irradiated on the surface of the hybrid nanoparticle 200 to a quantum dot core 110 in the nearest way, so as to increase the amount of excitation light received by the quantum dot core 110.

It can be seen that the excitation energy obtained by the quantum dot core 110 includes the following three parts:

a first part, the excitation energy generated by the excitation light directly irradiating on the quantum dot core 110;

a second part, the excitation energy generated by the near-field plasmon effect of the hybrid nanoparticle 200; and a third part, the excitation energy generated by the excitation light reflected by the hybrid nanoparticle 200 onto the quantum dot core 110.

By disposing hybrid nanoparticles in a quantum dot particle, at least the excitation light energy absorbed during the propagation process can be offset, and the energy received by the quantum dot core can be even enhanced. That is to say, the fluorescence yield of the quantum dot particle could be increased without increasing the energy of the excitation light.

The fluorescent particle is especially suitable for the field of cell analysis or cell imaging, and serious damage and destruction to cell structures or intracellular biological macromolecules can be avoided by using a lower excitation light energy.

In the present invention, the specific structure and specific material of the hybrid nanoparticle 200 are not particularly limited. For example, hybrid nanoparticles 200 can also be made of an ultraviolet absorbent. Generally, the ultraviolet absorbent has an optical antenna effect, which can realize the near-field plasmon effect under the action of excitation light.

The hybrid nanoparticles can be made of inorganic materials or organic materials.

Optionally, the hybrid nanoparticle 200 includes any one or more of nano ceria, nano zinc oxide, and black phosphorus quantum dot.

Specifically, nano ceria can be used as the hybrid nanoparticle 200. Nano ceria is an ultraviolet absorbent and has a weak metallicity, so it can not only realize an optical antenna effect, but also not cause quenching of quantum dot fluorescence. In addition, nano ceria is cheap, which can reduce the overall cost of the fluorescent particles.

The quantum dot core 110 has a size between 3 nm and 15 nm. The quantum dot core 110 may be at least one or more selected from CdTe, CdS, CdSe, ZnSe, InP, CuInS, CuInSe, PbS, CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, $CsPbCl_3/ZnS$, $CsPbBr_3/ZnS$, $CsPhI_3/ZnS$, and organic-inorganic perovskite quantum dot ($MAPbX_3$, MA is $CHSNH_3$, X is selected from any one of Cl, Br, and I), all-inorganic perovskite quantum dot ($CsPbX_3$, where X is selected from any one of Cl, Br, and I), carbon quantum dot and silicon quantum dot.

In the present invention, the specific structure of the quantum dot particle is not particularly limited, as long as the quantum dot particle includes at least one quantum dot core 110, a first protective layer 120 covering the quantum dot core 110, and a second protective layer 300 covering the first protective layer 120 and dispersed with at least one hybrid nanoparticle 200.

After the quantum dot core 110 is coated with the first protective layer 120, the quantum dot core 110 can be isolated from water and oxygen in the external environment, which can improve the stability of the quantum dot core 110 and increase the lifespan of the quantum dot particle.

In addition, coating the quantum dot core 110 with the first protective layer 120 can also passivate the surface of the quantum dot core 110 and occupy the surface defect sites of the quantum dot core 110, thereby eliminating the surface defects of the quantum dot core 110 and improving the lifespan of the quantum dot core 110.

In the present invention, thickness of the first protective layer 120 is not particularly limited as long as it can protect the quantum dot core 110 and allow excitation light to enter and fluorescence excited by the quantum dot to exit.

Optionally, the first protective layer 120 has a thickness between 2 nm and 50 nm, preferably between 3 nm and 20 nm, and more preferably between 3 nm and 10 nm.

The first protective layer may be an organic transparent protective layer or an inorganic transparent protective layer.

The organic transparent protective layer may be selected from cross-linked polystyrene, cross-linked polymethyl methacrylate, and the like.

The inorganic transparent protective layer may be made of an inorganic mesoporous material. Specifically, the inorganic transparent protective layer includes a mesoporous material layer 120a and an optical modifier 120b filled in the mesoporous material layer 120a.

The mesoporous material layer 120a and the optical modifier 120b together form a heterostructure in which the refractive index sequentially changes, so that the range of the emission spectrum of the quantum dot core 110 could be widened. Specifically, the refractive index of the inorganic mesoporous material and the optical modifier in the heterostructure sequentially change, thereby changing the emission direction of the light emitted by the quantum dot core, improving the light receiving rate of the quantum dot core, and changing the position of the emission peak of the emission spectrum (make it red-shift or blue-shift). For example, with a heterostructure formed by using an inorganic mesoporous material, an emission peak of 620 nm could be achieved by a quantum dot with an emission peak of 600 nm. Meanwhile, since the optical modifier 120b is a fluorescent response material, the fluorescent modifier 120b can emit light when the light emitted by the quantum dot core 110 is irradiated on the optical modifier 120b, thereby increasing the intensity of the emitted light of the fluorescent particle.

In the present invention, the material of the mesoporous material layer 120a is not particularly limited. As a preferred embodiment, the mesoporous material layer 120a includes at least one or more of mesoporous silicon dioxide, mesoporous aluminum oxide, and mesoporous titanium dioxide.

The optical modifier 120b may be a fluorescent dye. For example, it may be at least one or more of fluorescein isothiocyanate, phycoerythrin, Alexa Fluor series of fluorescent dyes (Molecular Probes, USA), Rhodamine series of dyes, and a compound and a conjugated polymer containing a benzene ring or heterocyclic ring and a conjugated double bond.

In order to fix the optical modifier 120b inside the mesoporous, the mesoporous and the optical modifier may be modified respectively with a first ligand functional group and a second ligand functional group which can be combined with each other. By this way, the optical modifier could be fixed inside the mesoporous.

In the present invention, there is no special requirement on types of the first ligand functional group on the inner surface of the mesoporous of the mesoporous material layer 120a, as long as this ligand functional group can combine with the second ligand functional group on the surface of the optical modifier 120b. For example, the first ligand functional group can be formed by using at least one of a monomer capable of thio-ene reaction, a monomer capable of Diels-Alder reaction, a monomer capable of 1,3-dipole cycloaddition reaction and a monomer capable of performing a substitution reaction between the active ester and the amino group.

Specifically, the inner surface of the mesoporous of the mesoporous material layer may be modified with a mercapto compound to obtain the first ligand functional group.

Further, the compound used to modify the mesoporous material layer includes at least one or more of 3-mercaptopropionic acid, hexanedithiol, octanethiol, dodecanethiol, hexadecanethiol, octadecanethiol, cysteamine, 2-mercaptoimidazole and (3-mercaptopropyl) trimethoxysilane.

In the present invention, material forming the second ligand functional group is not particularly limited. For example, a carbon-carbon double bond compound may be used to modify the optical modifier to obtain the second ligand functional group.

Optionally, the carbon-carbon double bond compound includes at least one or more of methyl acrylate, ethyl acrylate, ethylene, propylene, butene, 1-hexene, 2-ethyl-4-methyl-1-hexene, cyclobutadiene, cyclopentadiene, propadiene, ethenol and butenol.

In order to protect the first protective layer 120 and fix the hybrid nanoparticle 200, the quantum dot particle further includes a second protective layer 300 covering the first protective layer 120, and the hybrid nanoparticles 200 are dispersed in the second protective layer 300.

In the present invention, there is no special requirement on thickness of the second protective layer 300. For example, the second protective layer 300 has a thickness between 2 nm and 30 nm, preferably 10 nm to 30 nm. Such a thickness can protect the quantum dot core without affecting the propagation of light in the second protective layer 300.

The presence of the second protective layer 300 can also ensure the distance between the quantum dot core 110 and the hybrid nanoparticle 200, and prevent the hybrid nanoparticle 200 from falling off.

Material of the second protective layer 300 can be selected according to the specific application of the fluorescent particle. When the fluorescent particle is applied in the field of biomedicine, a polymer material with high biocompatibility may be used as the second protective layer 300, for example, a polymer with a functional group such as carboxyl group, amino group, mercapto group, aminopropyl group or acetylene group. In this embodiment, the above-mentioned polymer material can also be modified with a biological linker (for example, methoxy polyethylene glycol azide, mercapto polyethylene glycol, biotin succinimide ester, etc.), so that the fluorescent particle can be used as probe and label for targeted drugs.

The environment of biological cells is more complicated. In particular, under the influence of the cytoplasm, the fluorescence of ordinary quantum dot will be seriously reduced. The quantum dot particle provided by the present invention has a higher fluorescence yield, and even if the excitation energy is reduced during use, it can meet the tracking requirements and improve the signal-to-noise ratio with respect to the background signal.

As an embodiment of the present invention, the second protective layer 300 may be selected from any one or more of polymethyl methacrylate, polystyrene, cross-linked chitosan, cross-linked cellulose, and cross-linked polyvinyl pyrrolidone.

As a second aspect of the present invention, a method for preparing a quantum dot particle is provided, which includes:

providing at least one quantum dot core;

forming a first protective layer coating at least one quantum dot core;

attaching at least one hybrid nanoparticle on the first protective layer; and forming a second protective layer on the first protective layer so that the hybrid nanoparticle dispersed in the second protective layer, thereby obtaining the quantum dot particle;

wherein the hybrid nanoparticle is configured to generate a near-field plasmon effect under irradiation of excitation light.

The above-mentioned quantum particle could be obtained by such a method.

When a transparent polymer is used as the first protective layer, the method may include the following steps:

S1. providing a hydrosol containing a fluorescent quantum dot core;

S2. coating the fluorescent quantum dot core with a layer of transparent polymer, such as cross-linked polystyrene, cross-linked polymethyl methacrylate, etc.;

S3. adding a nano ceria particle into a solution of the quantum dot core coated with the polymer, and stirring under heating condition and adhering the nano ceria particle to the transparent polymer;

S4. forming a second protective layer on the polymer layer adhered with the nano ceria particle.

In step S2, the polymer may cover one or more quantum dot cores. By controlling the amount of polymer monomers, the molecular weight and thickness of the polymer can be controlled. The thickness of the first protective layer is 2-50 nm, preferably 2-20 nm.

In step S4, the second protective layer may be formed by performing a polymerization reaction in an organic solvent. The second protective layer can prevent the nano ceria particle from falling off and may have a thickness of 2-30 nm.

Figure 4:
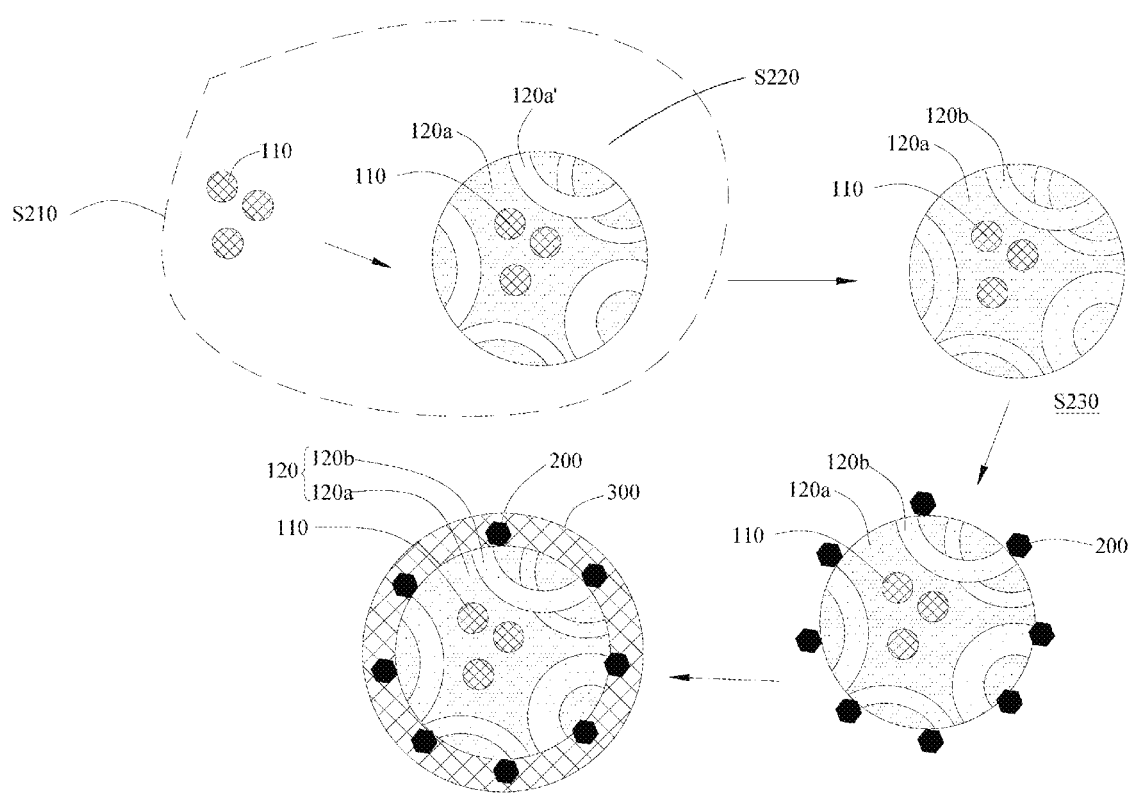
FIG. 4 is a schematic flow chart of the method for preparing the quantum dot particle of the present invention.

When an inorganic transparent mesoporous material is used as the first protective layer, as shown in FIG. 4, step S2 in the method of the present invention includes:

S210. mixing a precursor solution of the mesoporous material with a hydrosol containing at least one quantum dot core 110, heating and stirring, so as to obtain a quantum dot core coated with a mesoporous material layer 120a, wherein the mesoporous material layer 120a has a mesoporous 120a';

S220. modifying the mesoporous 120a' by mixing the mesoporous material layer 120a coating the quantum dot core with a mercapto compound, so as to making its surface have a first ligand functional group; and S230. filling an optical modifier 120b in the mesoporous 120a' by mixing the modified mesoporous material layer 120a coating the quantum dot core obtained in S220 with the optical modifier 120b; wherein a surface of the optical modifier 120b has a second ligand functional group formed by modification with a carbon-carbon double bond compound, and the optical modifier 120b is fixed inside the mesoporous 120a' by the combination of the first ligand functional group and the second ligand functional group.

Specifically, the compound used to modify the noumenon of the mesoporous material layer includes at least one or more of 3-mercaptopropionic acid, hexanedithiol, octanethiol, dodecanethiol, hexadecanethiol, octadecanethiol, cysteamine, 2-mercaptoimidazole and (3-mercaptopropyl)trimethoxysilane. The carbon-carbon double bond compound used to modify the surface of the optical modifier includes at least one or more of methyl acrylate, ethyl acrylate, ethylene, propylene, butene, 1-hexene, 2-ethyl-4-methyl-1-hexene, cyclobutadiene, cyclopentadiene, propadiene, ethenol and butenol.

As a specific embodiment, step S210 may include:

adding 0.2 mL of tetraethyl orthosilicate in 2 mL of hydrosol containing 0.01 g of CdSe/CdS fluorescent quantum dot core (with a particle size of about 3-5 nm), stirring and mixing uniformly; adding 0.1 mL of ammonia water or tetramethylammonium hydroxide aqueous solution (with a mass fraction of 0.5-2.5%) to the resulting colloidal solution, and stirring for 2 hours; afterwards, heating and stirring the colloidal solution at 80° C. until a mesoporous silica shell layer is formed on the surface of the CdSe/CdS quantum dot core, thereby obtaining a quantum dot core/mesoporous silica composite particle.

Preferably, the step of attaching the hybrid nanoparticle on the first protective layer includes stirring the quantum dot core coated with the first protective layer and the hybrid nanoparticle in an organic solvent. This step can be performed, for example, under heating condition, to facilitate the adhesion of the hybrid nanoparticle.

Specifically, the quantum dot core covered with the first protective layer is added to the organic solvent by a mass ratio of 1:50 to 1:100, and then the hybrid nanoparticle is added to the solvent. The hybrid nanoparticle 200 is attached to the surface of the first protective layer 120 by stirring.

In order to make the quantum dot particle suitable for the biomedical field, the particle obtained in step S230 can be preferably subjected to surface modification with materials such as methoxy polyethylene glycol azide, mercapto polyethylene glycol, biotin succinimide ester, etc., to improve the binding ability of the particle with molecules such as proteins.

The following is a brief introduction of how to prepare an optical film layer with the quantum dot particle provided by the present invention:

adding the quantum dot particle to a film-forming solution containing polyvinylidene fluoride (PVDF), so as to obtain a liquid mixture;

applying the liquid mixture to a substrate;

drying to obtain the optical film layer in vacuum.

As a third aspect of the present invention, it provides a photoluminescence device including a photoluminescence material layer, wherein the material of the photoluminescence material layer includes the above-mentioned quantum dot particle provided by the present invention.

As mentioned above, the quantum dot particle has a higher fluorescence yield. Therefore, the photoluminescence device also has a higher fluorescence quantum yield.

In the present invention, the photoluminescence device is not particularly limited by a specific structure.

As a first embodiment, the photoluminescence device may be a quantum dot-based light-emitting diode, and the quantum dot particle may be used to prepare a light-emitting layer of the quantum dot-based light-emitting diode.

As another embodiment of the present invention, the photoluminescence device may be a light source. Specifically, the photoluminescence device may be a single particle light source or a single particle laser.

It is understood that the above embodiments are only exemplary embodiments used to illustrate the principles of the invention, but the invention is not limited to them. For ordinary skilled in the art, various variations and improvements can be made without breaking away from the spirit and essence of the invention, which are also regarded as the protection scope of the invention.

The invention claimed is:

1. A quantum dot particle, including at least one quantum dot core, a first protective layer coating the quantum dot core and a second protective layer coating the first protective layer, wherein at least one hybrid nanoparticle is dispersed in the second protective layer and the hybrid nanoparticle is configured to generate a near-field plasmon effect under irradiation of excitation light.

2. The quantum dot particle according to claim 1, wherein the hybrid nanoparticle includes an ultraviolet absorber.

3. The quantum dot particle according to claim 1, wherein the hybrid nanoparticle is any one or more selected from nano ceria, nano zinc oxide and black phosphorus quantum dot.

4. The quantum dot particle according to claim 1, wherein the quantum dot core has a size of 3 nm to 15 nm.

5. The quantum dot particle according to claim 1, wherein the first protective layer is a first polymer layer having a thickness of between 2 nm and 50 nm.

6. The quantum dot particle according to claim 1, wherein the first protective layer includes a mesoporous material layer and an optical modifier filled in the mesoporous of the mesoporous material layer, wherein the mesoporous material layer and the optical modifier together form a heterostructure in which a refractive index changes sequentially.

7. The quantum dot particle according to claim 6, wherein the optical modifier is a fluorescent response material; when a light emitted by the quantum dot core is irradiated on the optical modifier, the optical modifier emits light.

8. The quantum dot particle according to claim 6, wherein the optical modifier is a fluorescent dye.

9. The quantum dot particle according to claim 6, wherein a material of the mesoporous material layer includes at least one or more of mesoporous silicon dioxide, mesoporous aluminum oxide and mesoporous titanium dioxide.

10. The quantum dot particle according to claim 1, wherein the second protective layer is a second polymer layer having a thickness between 2 nm and 30 nm.

11. The quantum dot particle according to claim 10, wherein the second protective layer includes any one or more of methyl methacrylate, divinyl benzene, cross-linked chitosan, cross-linked cellulose and cross-linked polyvinylpyrrolidone.

12. A method for preparing the quantum dot particle according to claim 1, which includes the following steps:
providing at least one quantum dot core;
forming a first protective layer coating at least one quantum dot core;
attaching at least one hybrid nanoparticle on the first protective layer; and
forming a second protective layer on the first protective layer so that the hybrid nanoparticle dispersed in the second protective layer, thereby obtaining the quantum dot particle;
wherein the hybrid nanoparticle is configured to generate a near-field plasmon effect under irradiation of excitation light.

13. The preparation method according to claim 12, wherein the step of forming a first protective layer in the preparation method includes:
forming a mesoporous material layer on the quantum dot core by mixing and reacting a precursor solution of the mesoporous material with at least one quantum dot core;
modifying the mesoporous material layer by mixing the mesoporous material layer with a mercapto compound, and a mesoporous surface of the modified mesoporous material layer has a first ligand functional group; and
filling an optical modifier in the mesoporous by mixing the modified mesoporous material layer with the optical modifier;
wherein the optical modifier has a second ligand functional group formed by modification with a carbon-carbon double bond compound on its surface, and the optical modifier is fixed inside the mesoporous by the combination of the first ligand functional group and the second ligand functional group.

14. The preparation method according to claim 12, wherein the step of attaching at least one hybrid nanoparticle outside the first protective layer includes:
stirring the quantum dot core coated with the first protective layer and the hybrid nanoparticle in an organic solvent under heating condition.

15. A photoluminescence device, including a photoluminescence material layer, wherein the photoluminescence material layer includes the quantum dot particle according to claim 11.

* * * * *